(12) United States Patent
Minoda

(10) Patent No.: US 7,629,563 B2
(45) Date of Patent: Dec. 8, 2009

(54) METHODS FOR ADJUSTING AND EVALUATING LIGHT INTENSITY DISTRIBUTION OF ILLUMINATION APPARATUS, ILLUMINATION APPARATUS, EXPOSURE APPARATUS, AND DEVICE MANUFACTURING METHOD

(75) Inventor: Ken Minoda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/970,687

(22) Filed: Jan. 8, 2008

(65) Prior Publication Data

US 2008/0173789 A1    Jul. 24, 2008

(30) Foreign Application Priority Data

Jan. 23, 2007    (JP)    ............................. 2007-013183

(51) Int. Cl.
*G01J 1/32* (2006.01)
(52) U.S. Cl. ........................................ 250/205; 355/53
(58) Field of Classification Search ................ 250/205, 250/201.1; 355/53, 67, 71
See application file for complete search history.

(56) References Cited

U.S. PATENT DOCUMENTS

| | | |
|---|---|---|
| 5,345,292 A | 9/1994 | Shiozawa et al. |
| 5,726,740 A | 3/1998 | Shiozawa et al. |
| 2006/0066193 A1* | 3/2006 | Ranish et al. ............... 313/116 |

FOREIGN PATENT DOCUMENTS

| | | |
|---|---|---|
| JP | 5-283317 A | 10/1993 |
| JP | 2001-033875 A | 2/2001 |

* cited by examiner

*Primary Examiner*—Seung C Sohn
(74) *Attorney, Agent, or Firm*—Canon U.S.A., Inc. I.P. Division

(57) ABSTRACT

A method is provided for adjusting a first light intensity distribution formed on a pupil plane of an illumination apparatus. The method includes measuring a first light intensity distribution; obtaining a first light intensity radial distribution and a second light intensity radial distribution; obtaining a first cumulative light quantity distribution in a radial direction and a second cumulative light quantity distribution in the radial direction; obtaining a difference at each of at least three points between the first cumulative light quantity distribution in the radial direction and the second cumulative light quantity distribution in the radial direction; and adjusting the first light intensity distribution based on the difference between the first cumulative light quantity distribution in the radial direction and the second cumulative light quantity distribution in the radial direction.

23 Claims, 16 Drawing Sheets

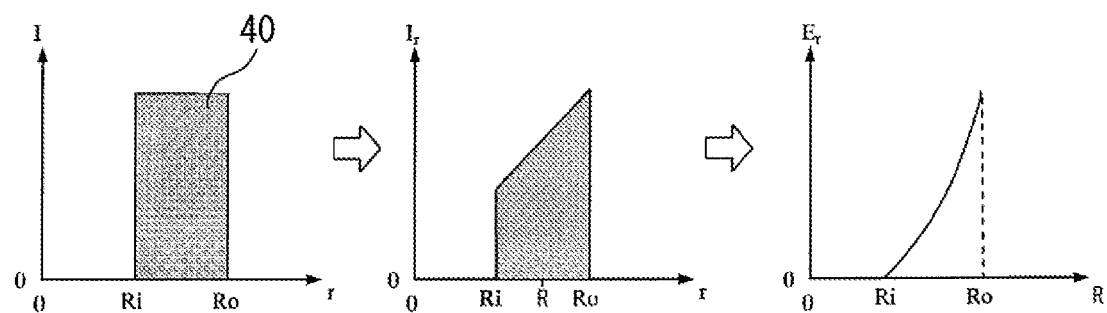

METHODS FOR ADJUSTING AND EVALUATING LIGHT INTENSITY DISTRIBUTION OF ILLUMINATION APPARATUS, ILLUMINATION APPARATUS, EXPOSURE APPARATUS, AND DEVICE MANUFACTURING METHOD

BACKGROUND OF THE INVENTION

1. Field of the Invention

The present invention relates to a method for adjusting and evaluating a light intensity distribution of an illumination apparatus, an illumination apparatus, an exposure apparatus, and a device manufacturing method.

2. Description of the Related Art

In a projection exposure apparatus configured to manufacture semiconductor devices, a light flux is emitted onto a pattern-formed reticle from an illumination optical system and the pattern is projected and exposed on a wafer by a projection optical system. Numerical aperture (NA) and lighting conditions of the projection optical system are optimized in manufacturing a semiconductor device having a finer pattern. The lighting conditions are determined by a coherence factor ($\sigma$ value=NA of the illumination optical system divided by NA of the projection optical system).

In the illumination optical system of the projection exposure apparatus, a relation of a secondary light source image formed by an optical integrator that is located in the illumination optical system to a surface to be illuminated corresponds to a relation of a pupil to the surface to be illuminated. Thus, the NA of the illumination optical system can be adjusted by changing the size of the secondary light source in the illumination optical system.

Further, Japanese Patent Application Laid-Open No. 5-283317 and Japanese Patent Application Laid-Open No. 2001-033875 discuss an illumination apparatus and an exposure apparatus capable of improving focal depth and resolution. Conventionally, according to the aforementioned apparatuses, an optimum secondary light source having various shapes of light distribution can be formed. Such shapes are, for example, an annular shape (a ring-like shape), a quadrupolar shape, etc.

If a light intensity distribution of a secondary light source formed on a pupil plane in the illumination optical system is substantially uniform, in other words, if the light intensity of the secondary light source is substantially uniform in the light distribution area, it is easy to grasp a relation between the size or shape of the light intensity distribution and imaging characteristics. However, the light intensity distribution of the secondary light source of the exposure apparatus is actually not uniform, and comparatively significant nonuniformity is seen in the intensity distribution.

Conventionally, only an outer shape, for example, positions where a cumulative light quantity distribution in the radial direction is 10% or 90% ($\sigma$ 10%, $\sigma$ 90%) of the total quantity of light are considered in an evaluation of a light intensity distribution regardless of nonuniformity of the light intensity distribution. However, even if light intensity distributions agree in positions of $\sigma$ 10% and $\sigma$ 90%, a difference in nonuniformity of the light intensity distribution may produce a difference in imaging performance. Thus, conventionally, imaging characteristics cannot be correctly evaluated based on the size and shape of a light intensity distribution and, for example, a variation in line width resolution may occur between different exposure apparatuses.

Further, in order to eliminate this inconvenience, the illumination apparatus and the exposure apparatus have to be repeatedly fine-controlled using an actual pattern.

On the other hand, there is known a simulation technique used for determining optimum lighting conditions for a reticle. However, in order to set a secondary light source equivalent to the lighting conditions acquired by the simulation in the exposure apparatus, for the same reason, the illumination apparatus and the exposure apparatus need to be fine-controlled using an actual pattern.

SUMMARY OF THE INVENTION

The present invention is directed to a method for adjusting and evaluating a light intensity distribution of an illumination apparatus, in which precise adjustment of, for example, a light intensity distribution formed on a pupil plane of an illumination apparatus substantially equivalent to a targeted light intensity distribution can be made in consideration of not only the outer shape but nonuniformity of the light intensity distribution.

According to an aspect of the present invention, a method is provided for adjusting a first light intensity distribution formed on a pupil plane of an illumination apparatus configured to illuminate a surface based on a light flux from a light source to a light intensity distribution substantially equivalent to a targeted second light intensity distribution. The method includes measuring the first light intensity distribution, obtaining a first light intensity radial distribution by integrating a light intensity of each point in an area in the measured first light intensity distribution in a circumferential direction with respect to a predetermined central point and a second light intensity radial distribution by integrating a light intensity of each point in an area in the second light intensity distribution in the circumferential direction with respect to a predetermined central point, obtaining a first cumulative light quantity distribution in a radial direction by integrating the first light intensity radial distribution in the radial direction with respect to the central point and a second cumulative light quantity distribution in the radial direction by integrating the second light intensity radial distribution in the radial direction with respect to the central point, obtaining a difference at each of at least three points between the first cumulative light quantity distribution in the radial direction and the second cumulative light quantity distribution in the radial direction, and adjusting the first light intensity distribution based on the difference between the first cumulative light quantity distribution in the radial direction and the second cumulative light quantity distribution in the radial direction.

According to another aspect of the present invention, a method is provided for adjusting a first multipolar light intensity distribution formed on a pupil plane of an illumination apparatus configured to illuminate a surface based on a light flux from a light source to a light intensity distribution substantially equivalent to a targeted second multipolar light intensity distribution. The method includes measuring the first multipolar light intensity distribution, obtaining a first light intensity angle distribution by integrating a light intensity of each point in an area in a light intensity distribution of a first pole in the measured first multipolar light intensity distribution in a radial direction with respect to a predetermined central point and a second light intensity angle distribution by integrating a light intensity of each point in an area in a light distribution of a second pole, corresponding to the first pole, in the second multipolar light intensity distribution in the radial direction with respect to a predetermined central point, obtaining a first cumulative light quantity distribution in a circumferential direction by integrating the first light intensity angle distribution in the circumferential direction with respect to the central point and a second cumulative light quantity distribution in the circumferential direction by integrating the second light intensity angle distribution in the circumferential direction with respect to the central point, obtaining a difference at each of at least two points between the first cumulative light quantity distribution in the circumferential direction of the first pole in the first multipolar light intensity distribution and the second cumulative light quantity distribution in the circumferential direction of the second pole in the second multipolar light intensity distribution, and adjusting the first multipolar light intensity distribution based on the difference between the first cumulative light quantity distribution in the circumferential direction and the second cumulative light quantity distribution in the circumferential direction.

According to yet another aspect of the present invention, a method is provided for evaluating a first light intensity distribution formed on a pupil plane in an illumination apparatus as a second light intensity distribution that is uniform and equivalent to the first light intensity distribution. The method includes obtaining a light intensity radial distribution by integrating a light intensity of each point in an area in the first light intensity distribution in a circumferential direction with respect to a predetermined central point, obtaining a cumulative light quantity distribution in a radial direction by integrating the light intensity radial distribution in the radial direction with respect to the central point, and obtaining a parameter of the second light intensity distribution with a minimum square sum of difference at each of at least three points between the cumulative light quantity distribution in the radial direction obtained from the first light intensity distribution and a cumulative light quantity distribution in the radial direction obtained from the second light intensity distribution.

According to yet another aspect of the present invention, a method is provided for evaluating a first multipolar light intensity distribution formed on a pupil plane in an illumination apparatus as a second multipolar light intensity distribution that is uniform and equivalent to the first multipolar light intensity distribution. The method includes obtaining a light intensity angle distribution by integrating a light intensity of each point in an area in the first multipolar light intensity distribution in a radial direction with respect to a predetermined central point, obtaining a cumulative light quantity distribution in a circumferential direction by integrating the light intensity angle distribution corresponding to a first pole in the first multipolar light intensity distribution in the circumferential direction with respect to the predetermined central point from a predetermined angle, and obtaining an aperture angle of a second pole, corresponding to the first pole, in the second multipolar light intensity distribution with a minimum square sum of difference at each of at least two points between the cumulative light quantity distribution of the first pole in the circumferential direction and a cumulative light quantity distribution of the second pole in the circumferential direction.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 7A to 7C illustrate an example of a uniform light intensity distribution having an annular shape, a light intensity radial distribution that is obtained by integrating the uniform light intensity distribution having an annular shape in the circumferential direction, and a cumulative light quantity distribution in the radial direction.

DETAILED DESCRIPTION OF THE EMBODIMENTS

Various exemplary embodiments, features, and aspects of the invention will be described in detail below with reference to the drawings.

First Exemplary Embodiment

Figure 1:
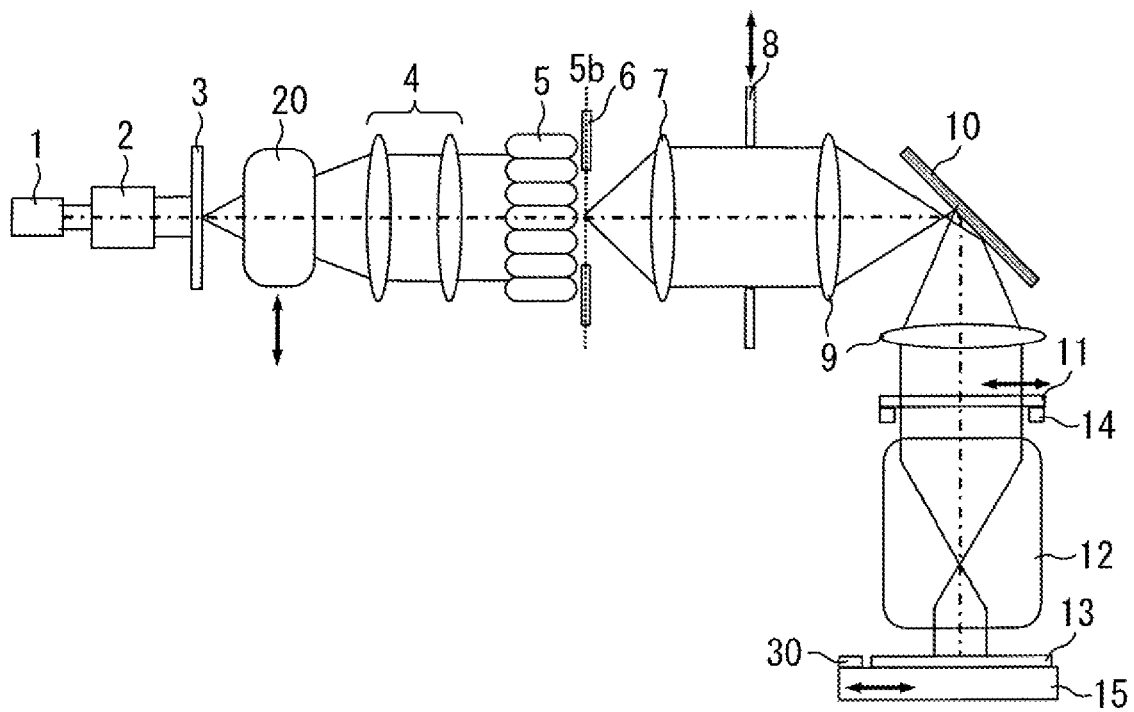
FIG. 1 illustrates an example of a configuration of a projection exposure apparatus according to a first exemplary embodiment of the present invention.

FIG. 1 illustrates an example of a configuration of a projection exposure apparatus according to a first exemplary embodiment of the present invention.

The projection exposure apparatus uses, as a light source 1, krypton fluoride (KrF) excimer laser with a wavelength of 248 nm, argon fluoride (ArF) excimer laser with a wavelength of 193 nm, or an extra high pressure mercury lamp. Light emitted from the light source 1 is shaped into a predetermined light flux shape by a light flux shaping optical system 2. Then, the shaped light flux enters a diffractive optical element 3 in a direction substantially parallel to the optical axis.

The parallel light flux, which has entered the diffractive optical element 3, is converted into a diverging light flux having a predetermined angle distribution and then forms distribution of a shape, such as an annular shape or a quadrupolar shape, on an entrance surface of a fly-eye lens 5 via a collimator lens 4. The diffractive optical element 3, which is disposed on a turret, is configured to form a great number of distributions on the fly-eye lens 5.

A focal length of the collimator lens 4 in a zoom optical system is adjustable. The light intensity distribution formed on the fly-eye lens 5 can be adjusted by the diffractive optical element 3.

The fly-eye lens 5 includes a plurality of micro lens elements that are arranged two-dimensionally. A back focal plane of the fly-eye lens 5 serves as an illumination pupil plane 5b of an illumination optical system. Thus, the light flux that enters the fly-eye lens 5 is divided two-dimensionally and forms a secondary light source on the illumination pupil plane 5b. The illumination pupil plane 5b includes a diaphragm member 6 disposed on a turret. The diaphragm member 6 blocks passage of extraneous light so that a predetermined light intensity distribution can be achieved.

A size and a shape of an aperture of the diaphragm member 6 are changeable by a diaphragm drive mechanism (not illustrated). A collimator lens 7 superimposes light emitted from a secondary light source, which is formed on the illumination pupil plane 5b, onto a field stop 8. The field stop 8 is located in a position conjugate with a reticle (mask) 11, serving as a surface to be illuminated, and, further, with a wafer 13.

The field stop 8 controls the illumination area on the reticle 11. Further, the field stop 8 includes a plurality of movable light-blocking plates to form a desired aperture shape. An imaging optical system 9 projects an aperture shape formed by the field stop 8 via a deflection member 10 onto the reticle 11, which is supported by a reticle stage 14. A projection optical system 12 forms an image of a pattern of the reticle 11 onto the wafer 13, which is supported by a wafer stage 15. During exposure, the reticle stage 14 and the wafer stage 15 are driven in synchronization with each other. Also, a photosensitive material applied to the wafer 13 is exposed by a projection of the pattern of the reticle 11 and developed to form a circuit pattern on the wafer 13.

A light intensity distribution adjustment unit 20 includes an optical element configured to change the shape of the light intensity distribution, such as an annular ratio (the inner diameter of the annular zone divided by the outer diameter of the annular zone) or an aperture angle, according to illumination conditions, such as annular or quadrupolar illumination. The light intensity distribution adjustment unit 20, which is arranged on a turret, is configured to change the optical element according to an angle distribution formed by the diffractive optical element 3.

A light detector 30, which is used for measuring the light intensity distribution on the illumination pupil plane 5b, is located on the wafer stage 15 according to an exemplary embodiment. For example, a two-dimensional charge-coupled device (CCD) sensor is used for the light detector 30.

It is to be noted that the illumination apparatus according to an exemplary embodiment of the present invention also includes an illumination optical system, which extends from the light source 1 to the projection optical system 12, in addition to the light intensity distribution adjustment unit 20.

Figure 2:
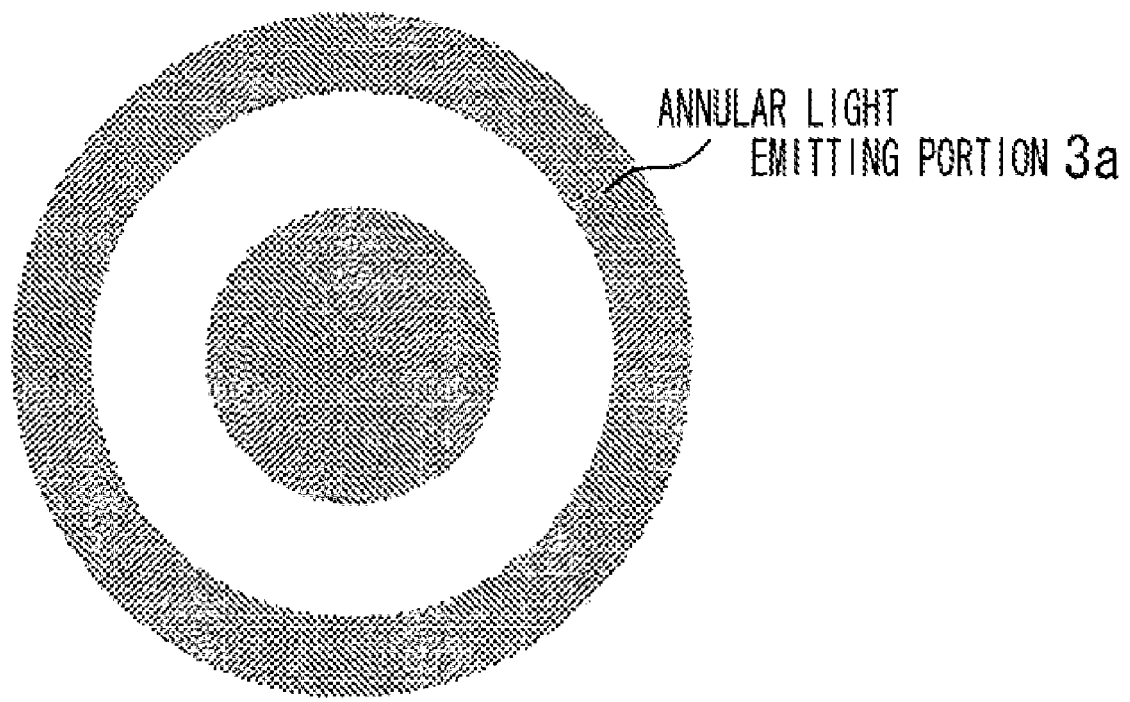
FIG. 2 illustrates an example of a light intensity distribution having an annular shape according to the first exemplary embodiment of the present invention.
Figure 3A:
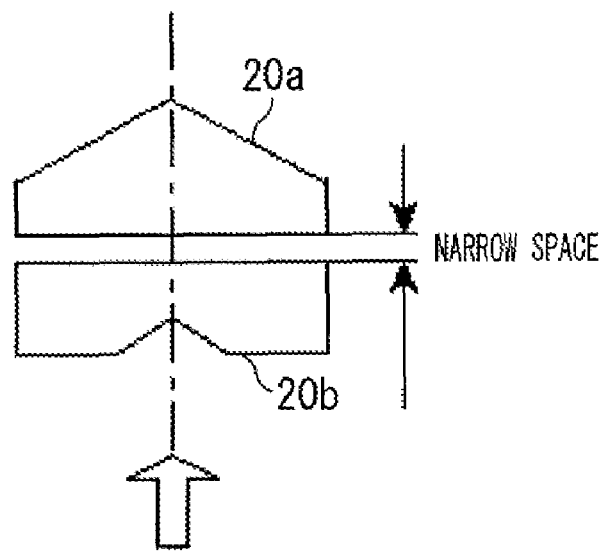
FIG. 3A illustrates an example of a light intensity distribution adjustment configuration configured to form a light intensity distribution having an annular shape with a high annular ratio according to the first exemplary embodiment of the present invention.
Figure 4A:
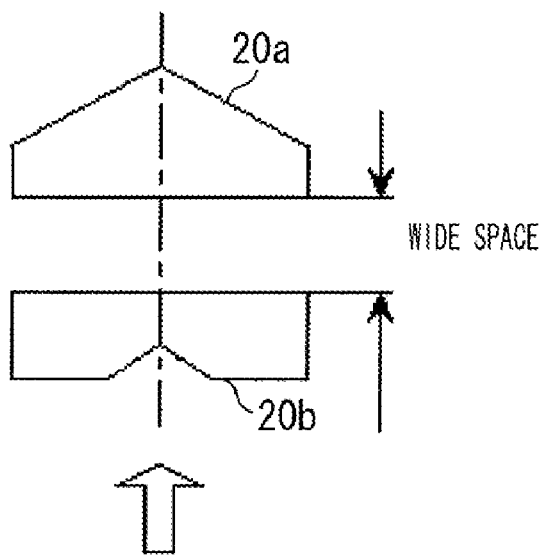
FIG. 4A illustrates an example of a light intensity distribution adjustment configuration configured to form a light intensity distribution having an annular shape with a low annular ratio according to the first exemplary embodiment of the present invention.

The light intensity distribution adjustment unit 20 will be described in detail below. An annular light emitting portion 3a illustrated in FIG. 2 is a cross section of a light flux that emerges from the diffractive optical element 3 and is perpendicular to the optical axis. A pair of prisms 20a and 20b (see FIGS. 3A and 4A) in the light intensity distribution adjustment unit 20 are used to change the annular ratio of the annular light emitting portion 3a. The pair of prisms 20a and 20b can be relatively displaced in the optical-axis direction as illustrated in FIG. 3A and FIG. 4A. The prism 20b has a concave conical surface on its entrance side and a flat surface on the exit side. The prism 20a has a flat surface on its entrance side and a convex conical surface on the exit side.

Figure 3B:
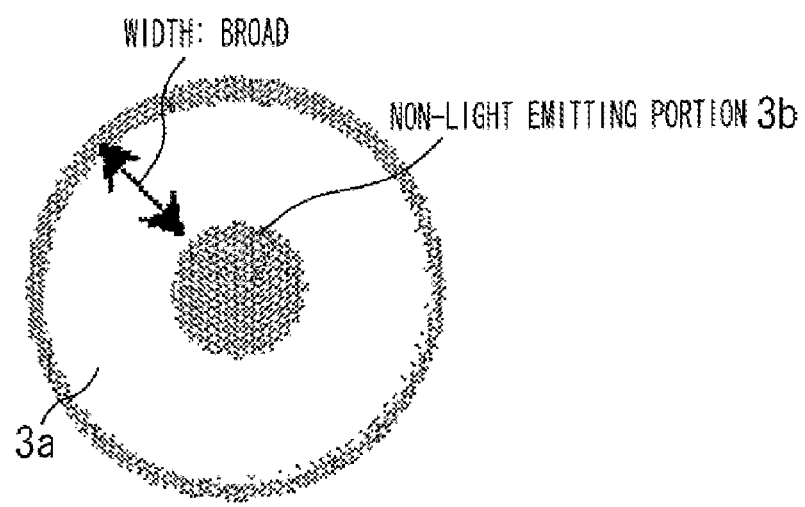
FIG. 3B illustrates an example of a light intensity distribution having an annular shape with an annular ratio indicating a broad width, which is formed by the light intensity distribution adjustment configuration.
Figure 4B:
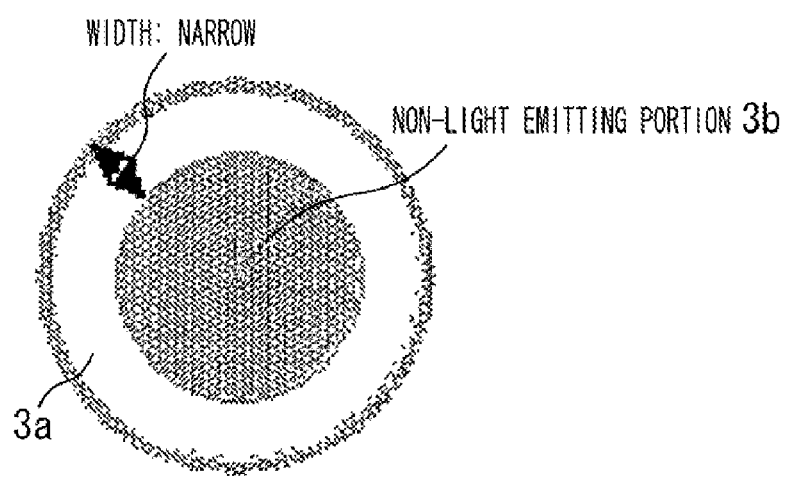
FIG. 4B illustrates an example of a light intensity distribution having an annular shape with an annular ratio indicating a narrow width, which is formed by the light intensity distribution adjustment configuration.

If the distance between the pair of prisms 20a and 20b is small as illustrated in FIG. 3A, a broad annular light emitting portion 3a with a small non-light emitting portion 3b is formed as illustrated in FIG. 3B. In other words, a light intensity distribution with a low annular ratio is formed. On the other hand, if the distance between the pair of prisms 20a and 20b is increased as illustrated in FIG. 4A, a narrow annular light emitting portion 3a with a large non-light emitting portion 3b is formed as illustrated in FIG. 4B. In other words, a light intensity distribution with a high annular ratio is formed.

Therefore, by combining the light intensity distribution adjustment unit 20 with an angle of diffraction distribution of the diffractive optical element 3 in the preceding stage and a zoom of the collimator lens 4 in the subsequent stage, various light intensity distributions can be formed and adjusted with high flexibility.

Next, a method for measuring an intensity distribution on the illumination pupil plane 5b in the illumination optical system will be described. The projection optical system 12 is configured to be substantially telecentric on both sides of the reticle 11 and the wafer 13. Thus, when the reticle 11 is not set, a secondary light source image formed on the illumination pupil plane 5b in the illumination optical system is formed on a pupil position of the projection optical system 12.

Subsequently, the wafer stage 15 is illuminated with Koehler illumination with the light that has passed through the projection optical system 12.

Further, the light angle distribution on a surface to be illuminated, on which the reticle 11 is positioned, corresponds to the light intensity distribution on the pupil plane in the illumination optical system or the pupil position in the projection optical system. Thus, by determining the angle distribution of the light for exposing the wafer stage 15, a light intensity distribution (secondary light source or effective light source) on the illumination pupil plane 5b in the illumination optical system can be measured.

When measuring the light intensity distribution, the reticle 11 with micro-apertures formed by a chrome (Cr) pattern is positioned on the reticle stage 14 while the light detector 30 located on the wafer stage 15 is defocused in the optical-axis direction from the actual wafer reference plane. As a result, only the light regulated by the micro-apertures in the reticle 11 provides an image for one time on the wafer plane, and then the light enters the light detector 30 while maintaining the angle distribution. Thus, the light intensity distribution on the illumination pupil plane 5b can be measured by obtaining the angle distribution of the projection light from the light intensity distribution detected by the light detector 30.

Next, processes for setting a light intensity distribution, which is substantially equivalent to a targeted light intensity distribution having an annular shape, on the exposure apparatus will be described.

The adjustment technique employed in the present exemplary embodiment uses a setting technique by which a light intensity distribution substantially equivalent to the targeted light intensity distribution is realized in the exposure apparatus. Such targeted light intensity is, for example, an optimum light intensity distribution computed by a simulation process or a light intensity distribution on a pupil plane that is calculated based on an apparatus whose imaging performance needs to match that of another exposure apparatus. Further, an adjustment technique is used for setting a light intensity distribution, which is substantially equivalent to the targeted light intensity distribution having an annular shape, in the exposure apparatus.

Figure 5:
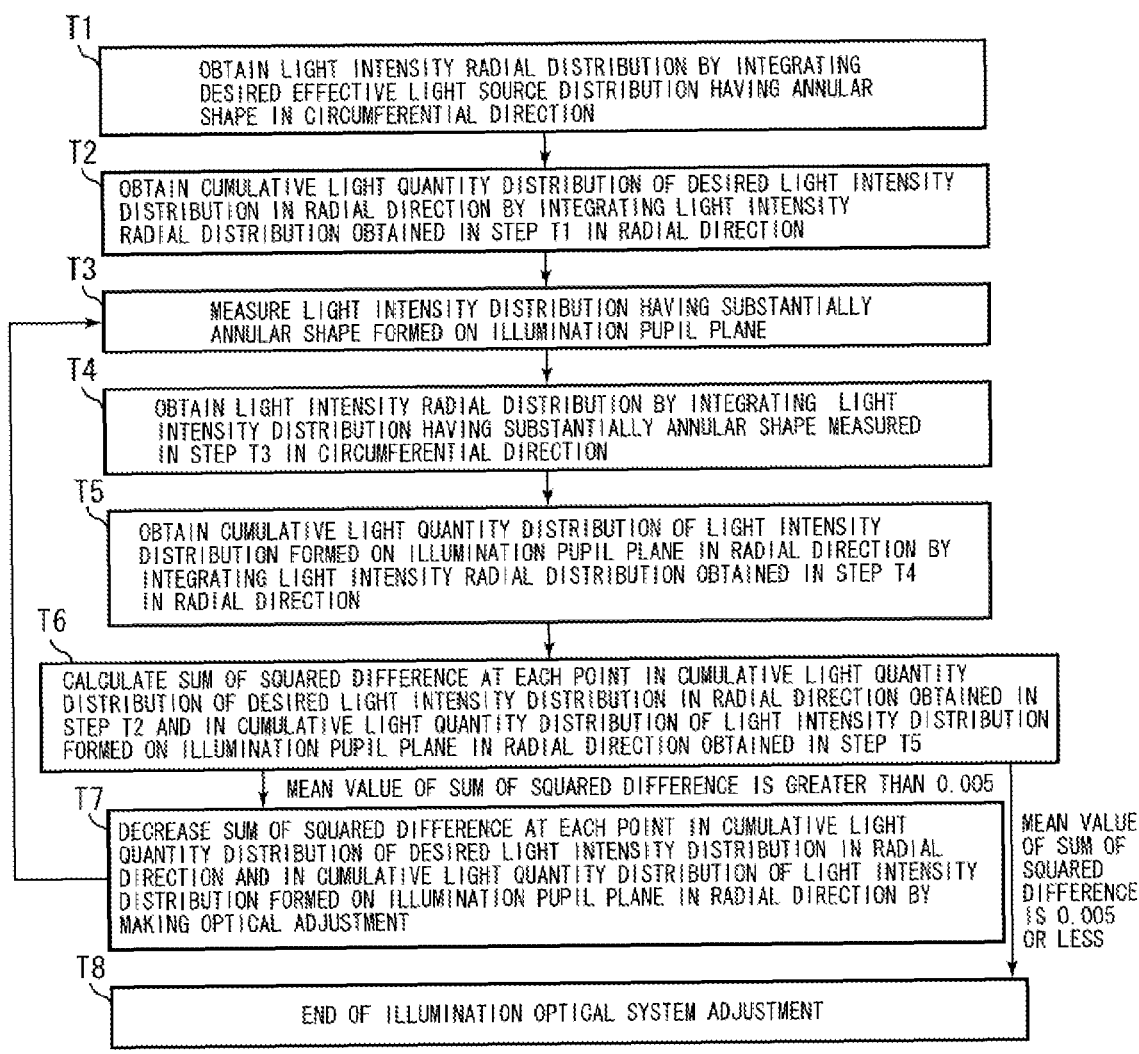
FIG. 5 is a flowchart illustrating a light intensity distribution adjustment process in the illumination apparatus according to the first exemplary embodiment of the present invention.
Figure 6:
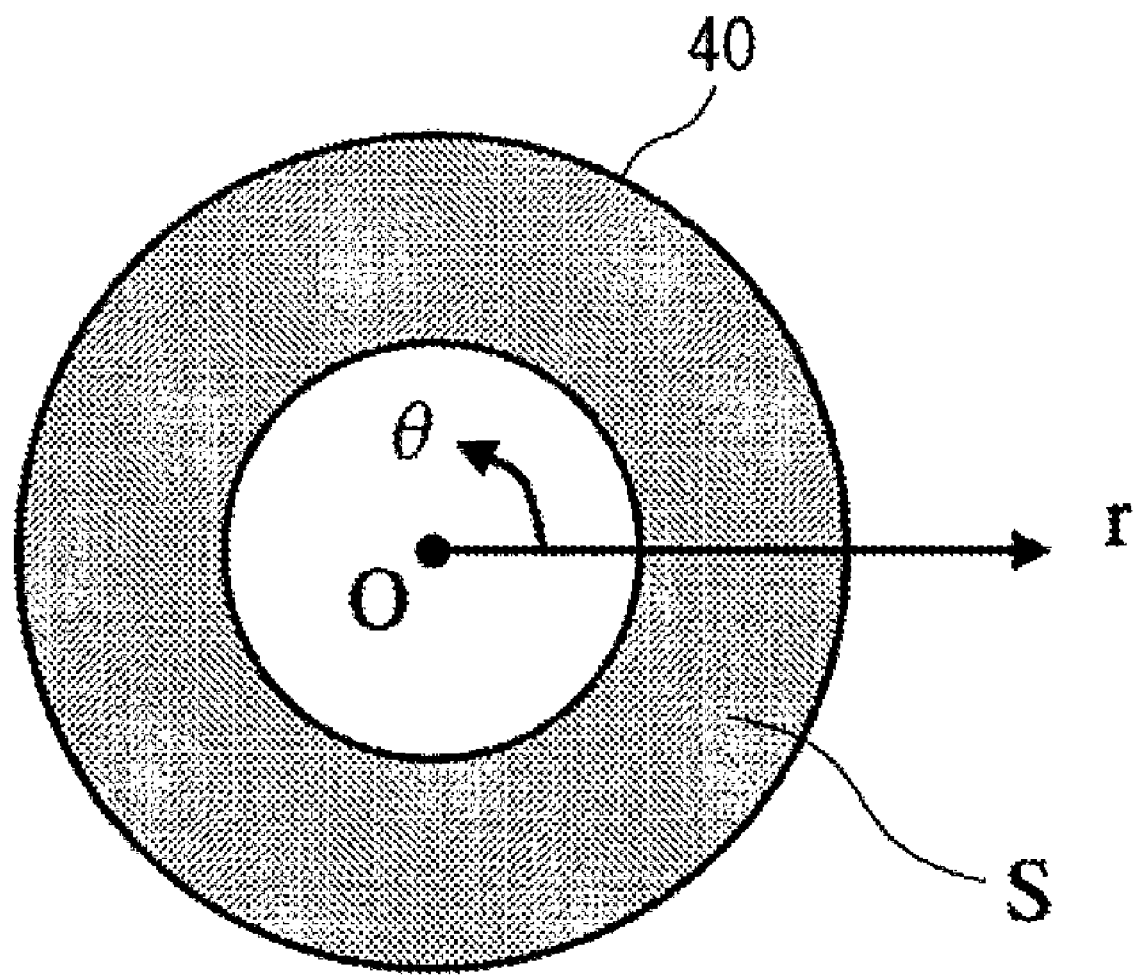
FIG. 6 illustrates an example of a method for setting polar coordinates (r, θ) in a uniform light intensity distribution having an annular shape according to the first exemplary embodiment of the present invention.

FIG. 5 is a flowchart illustrating processes of an adjustment method used for setting the light intensity distribution that is substantially equivalent to a targeted light intensity distribution having an annular shape in the exposure apparatus. According to the present exemplary embodiment, a uniform light intensity distribution 40 having a top-hat-like annular shape as illustrated in FIG. 6 will be given as an example of the targeted light intensity distribution.

In step T1, the adjustment method obtains a light intensity radial distribution Ir(r) by integrating a light intensity distribution at a point with a distance r from a predetermined central point of the target light intensity distribution 40. More specifically, the adjustment method sets polar coordinates (r, θ), having the predetermined central point O at the center of the uniform light intensity distribution 40 having an annular shape illustrated in FIG. 6. The radial coordinate r is a radius of the polar coordinates and the angular coordinate θ is a radial angle. That is, in step T1, the adjustment method obtains a light intensity radial distribution Ir (r) of the uniform light intensity distribution 40 having an annular shape by the following equation (1), in which a light intensity I(r, θ) at each point within an area S (r=Ri–Ro, θ=0–2π) in the light intensity distribution 40 is integrated in the circumferential direction (θ=0–2π).

$$I_r(r) = \int_0^{2\pi} I(r, \theta) \cdot r\, d\theta \quad (1)$$

The light intensity radial distribution of the uniform light intensity distribution 40 having an annular shape illustrated in FIG. 7A is illustrated in FIG. 7B.

Next, in step T2, the adjustment method obtains a cumulative light quantity distribution Er (R) by the following equation (2), in which the light intensity radial distribution Ir(r), which is calculated in step T1, is integrated in the radial direction (r=0–R). Here, the equation (2) is normalized by a total quantity of light of the light intensity distribution 40 having an annular shape.

$$E_r(R) = \int_0^R I_r(r)\, dr \Big/ \int\int_S I(r, \theta) \cdot r\, dr\, d\theta \quad (2)$$

The uniform cumulative light quantity distribution having an annular shape illustrated in FIG. 7A is illustrated in FIG. 7C.

Figures 8A, 8B, 8C:
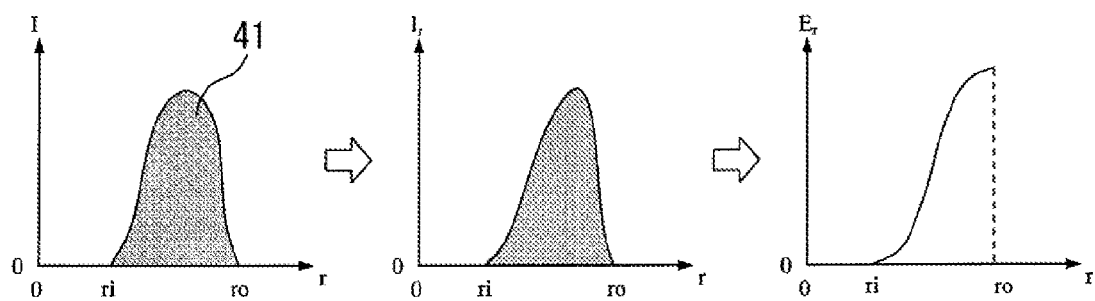
FIGS. 8A to 8C illustrate a light intensity distribution having a substantially annular shape that is measured using the illumination apparatus according to the first exemplary embodiment of the present invention, a corresponding light intensity radial distribution, and a corresponding cumulative light quantity distribution in the radial direction.

In step T3, the adjustment method measures a light intensity distribution 41, which serves as a first light intensity distribution, formed on the illumination pupil plane 5b in the illumination optical system, as illustrated in FIG. 8A, using, for example, the light detector 30.

In step T4, the adjustment method calculates a distribution of a sum of light intensity at each distance R in the light intensity distribution 41 obtained in step T3. The process in step T4 is similar to step T1. In other words, the adjustment method obtains a light intensity radial distribution by integrating the light intensity of each point in the area of the light intensity distribution 41, which serves as the first light intensity distribution, in the circumferential direction from the central point.

In step T5, the adjustment method integrates the light intensity radial distribution of the light intensity distribution 41 obtained in step T4 in the radial direction to obtain a cumulative light quantity distribution in the radial direction of the light intensity distribution 41 formed on the illumination pupil plane 5b. That is, the adjustment method calculates a cumulative light quantity distribution of the light intensity distribution 41 having a substantially annular shape, as in step T2. If, for example, the distribution of the light intensity distribution 41 on the illumination pupil plane 5b is as illustrated in FIG. 8A, the light intensity radial distribution will be as illustrated in FIG. 8B and the cumulative light quantity distribution in the radial direction will be as illustrated in FIG. 8C.

Next, in step T6, the adjustment method calculates a square sum of difference at each of at least three points between the cumulative light quantity distribution of the targeted light intensity distribution 40 in the radial direction and the cumulative light quantity distribution of the light intensity distribution 41 on the illumination pupil plane 5b in the radial direction. That is, the adjustment method calculates a sum of squared difference at each distance R in an area S between the uniform cumulative light quantity distribution of the light intensity distribution 40 (FIG. 7C) having an annular shape in step T2 and the cumulative light quantity distribution of the light intensity distribution 41 (FIG. 8C) having a substantially annular shape on the illumination pupil plane 5b in the illumination optical system obtained in step T5. At this time, a number n of the divided portions of the distance r, which is a distance from the central point to a point having the radial coordinate r, can be high in number, i.e., a larger number of calculation steps is useful. However, the number n of divided portions is actually determined according to computation time and adjustment precision.

For example, a total number n of divided portions of the distance r, which is a distance from the central point of the targeted light intensity distribution 40 to a point having the radial coordinate r, can be about 500 in the area S of the light intensity distribution. The targeted light intensity distribution 40 and the light intensity distribution 41 will have similar imaging characteristics if a squared sum of difference between the cumulative light quantity distribution at each distance R of the targeted light intensity distribution 40 and the cumulative light quantity distribution at each distance R of the measured light intensity distribution 41 formed on the illumination pupil plane 5b in the illumination optical system is small.

If a mean value of a sum of squared difference (sum of squared difference/n) between each distance R in the cumulative light quantity distributions is 0.005 or less, the light intensity distribution 41 having a substantially annular shape formed on the illumination pupil plane 5b is determined as practically and sufficiently equivalent to the targeted uniform light intensity distribution 40 having an annular shape.

Thus, if a mean value of a sum of squared difference (sum of squared difference/n) between each R in the cumulative light quantity distributions is 0.005 or less, the adjustment of the illumination optical system or the illumination apparatus ends in step T8.

However, if the aforementioned mean value of a sum of squared difference between each distance R in the cumulative light quantity distributions becomes greater than 0.005, then in step T7, an optical adjustment will be made so that the sum of squared difference between each point in the cumulative light quantity distribution, in the radial direction, of the targeted light intensity distribution 40 and the cumulative light quantity distribution, in the radial direction, of the light intensity distribution 41 formed on the illumination pupil plane 5b becomes small. That is, the adjustment method adjusts the light intensity distribution 41 formed on the illumination pupil plane 5b so that a sum of squared difference between each distance R in the cumulative light quantity distributions of the targeted light intensity distribution 40 and the light intensity distribution 41 formed on the illumination pupil plane 5b is decreased.

Then, the process returns to step T3, where the adjustment method measures the light intensity distribution formed on the illumination pupil plane 5b and repeats the above-described processing until a mean value of the sum of squared difference between each distance R in the cumulative light quantity distributions becomes 0.005 or less. That is, the adjustment method adjusts the light intensity distribution 41 so that a mean value of a sum of squared difference at each of at least three points in the cumulative light quantity distributions in the radial direction is 0.005 or less, where a total quantity of light in each of the light intensity distribution 40 and the light intensity distribution 41 is 1.

If the mean value of the sum of a squared difference at each distance R in the cumulative light quantity distributions is 0.005 or less but the difference can be reduced further, the illumination optical system or the illumination apparatus can be adjusted accordingly.

In this way, the light intensity distribution formed on the illumination pupil plane in the illumination apparatus can be adjusted with high precision to the light intensity distribution which is substantially equivalent to the targeted light intensity distribution in consideration of not only its shape but its nonuniform distribution. Accordingly, without actually printing a pattern to confirm the light intensity distribution, a difference of imaging characteristics in exposure apparatuses can be adjusted, and an optimum light intensity distribution for a device pattern can be set with high precision in an exposure apparatus.

The above description describes a method for setting a light intensity distribution, which is equivalent to a targeted uniform light intensity distribution having an annular shape, on the illumination pupil plane 5b in the illumination optical system.

Next, an evaluation method for the light intensity distribution of the illumination apparatus according to the first exemplary embodiment will be described. By exchanging a role of the light intensity distribution 41 on the illumination pupil plane 5b in the illumination optical system with the targeted uniform light intensity distribution 40 having an annular shape, the light intensity distribution in the exposure apparatus can be evaluated as a uniform light intensity distribution having an annular shape.

Thus, an evaluation method for the light intensity distribution of the illumination apparatus according to the present exemplary embodiment first obtains a light intensity radial distribution by integrating a light intensity of each point in the area within the first light intensity distribution having a circular or a substantially annular shape in the circumferential direction. Next, the evaluation method obtains a cumulative light quantity distribution by integrating the light intensity radial distribution in the radial direction with respect to the central point.

That is, the evaluation method obtains, for example, a uniform light intensity distribution 40 having an annular shape with a minimum sum of squared difference of each distance R in a cumulative light quantity distribution and a light intensity distribution 41 having a substantially annular shape formed on the illumination pupil plane 5b in the illumination optical system that is measured by the light detector 30. It is apparent that the light intensity distribution 40 has a uniform light intensity distribution with an annular shape that is substantially equivalent to the light intensity distribution 41. Thus, the evaluation method can evaluate the measured light intensity distribution 41 having a substantially annular shape by obtaining an outer diameter Ro, an inner diameter Ri, an annular ratio (Ri/Ro), etc., which are main parameters of a substantially equivalent light intensity distribution having a uniform annular shape.

In this way, the light intensity distribution 41, which serves as the first light intensity distribution, can be evaluated as the uniform light intensity distribution 40, which serves as a second light intensity distribution, having an annular shape equivalent to the light intensity distribution 41. It is to be noted that, as for a light intensity distribution having a substantially circular shape, a radius of a light intensity distribution having an equivalent and uniform circular shape can be obtained using a similar method.

According to the above-described method for evaluating a light intensity distribution, if a uniform light intensity distribution 41 having a circular or annular shape equivalent to the targeted light intensity distribution 40 having a circular or annular shape is obtained in advance, a time length required for adjusting the illumination apparatus can be reduced. That is, by making an optical adjustment so that a uniform light intensity distribution having an annular shape equivalent to the light intensity distribution 41 formed on the illumination pupil plane 5b is equivalent to a targeted uniform light intensity distribution having an annular shape, a light intensity distribution that is substantially equivalent to the targeted uniform light intensity distribution can be formed on the illumination pupil plane 5b. In other words, a light intensity distribution 41 that is substantially equivalent to the targeted light intensity distribution can be formed on the illumination pupil plane 5b and the apparatus adjustment time can be reduced.

While the first present exemplary embodiment has been described with reference to the adjustment and evaluation of the light intensity distribution 41 having a substantially annular shape, it is to be understood that the present invention is not limited to such an example. For example, the adjustment and evaluation according to the first exemplary embodiment of the present invention can be applied to a light intensity distribution having a substantially circular shape or a light intensity distribution having a multipolar shape. In particular, the evaluation and adjustment method for a light intensity distribution having a substantially circular shape is similar to the adjustment and evaluation method for the light intensity distribution 41 having an annular shape as described above.

Second Exemplary Embodiment

A second exemplary embodiment of the present invention will be described below. Here, as an example of adjusting a light intensity distribution having a multipolar shape, an adjustment method for forming a light intensity distribution, which is equivalent to a targeted light intensity distribution having a bipolar shape (FIG. 9A) with uniform light intensity distributions 50a and 50b, on the illumination pupil plane in the illumination optical system will be described.

Figure 10:
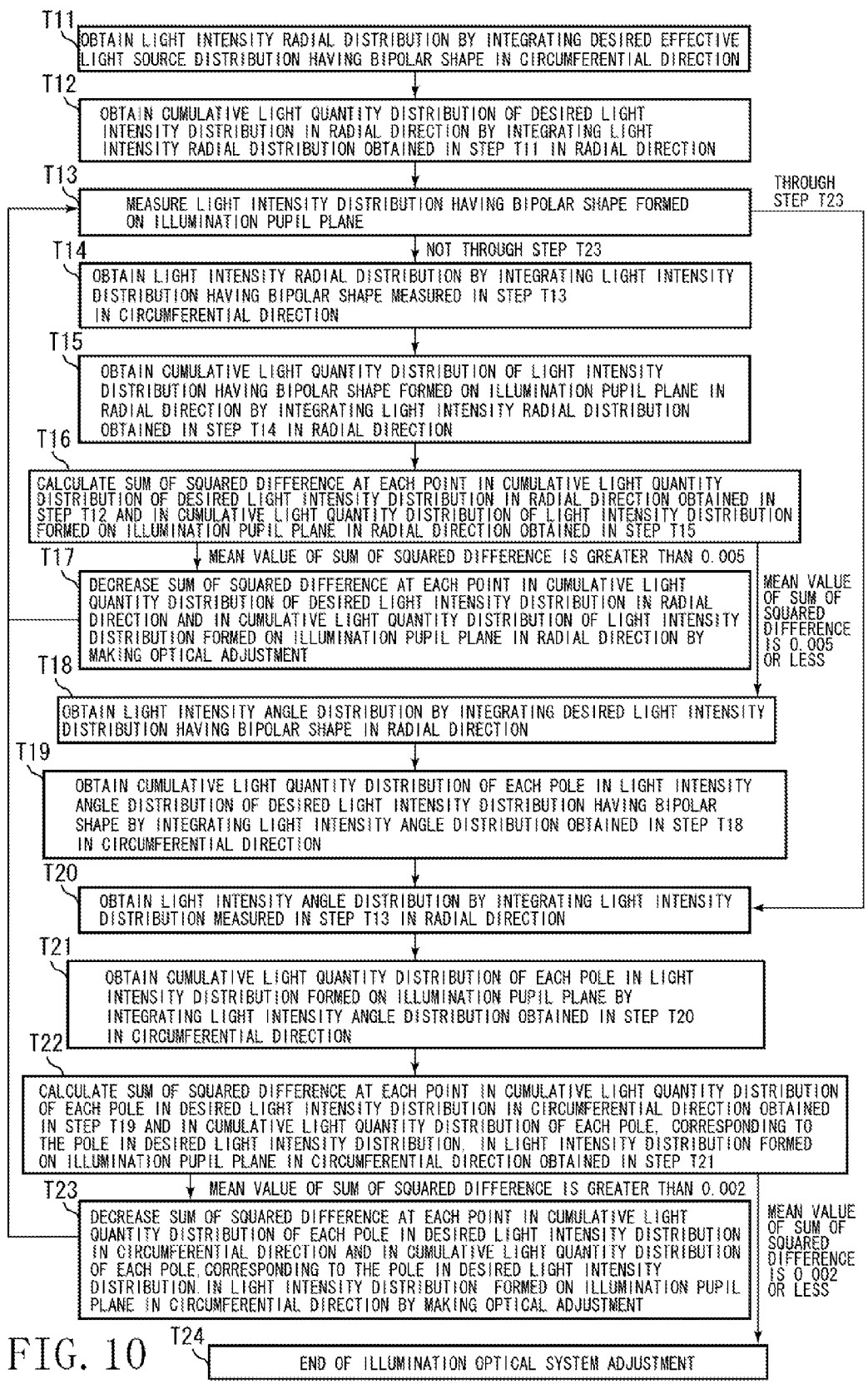
FIG. 10 is a flowchart illustrating an adjustment process for a light intensity distribution having a bipolar shape in an illumination apparatus according to the second exemplary embodiment of the present invention.

FIG. 10 is a flowchart illustrating processes of an adjustment method used for forming a light intensity distribution that is equivalent to a targeted light intensity distribution including a uniform light intensity distribution having a bipolar shape on the illumination pupil plane in the illumination optical system.

Figure 9A:
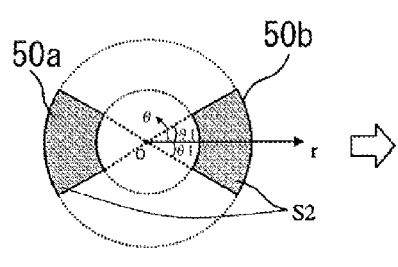
FIGS. 9A to 9C illustrate a uniform light intensity distribution having a bipolar shape, a light intensity angle distribution that is obtained by integrating one pole of the uniform light intensity distribution having a bipolar shape in the radial direction, and a cumulative light quantity distribution in the circumferential direction according to a second exemplary embodiment of the present invention.

First, in step T11, the adjustment method obtains, for example, a light intensity radial distribution by integrating a targeted effective light source having a bipolar shape (light intensity distributions 50a and 50b), which serves as a second light intensity distribution, in the circumferential direction. That is, in step T11, the adjustment method sets polar coordinates (r, θ) having a central point O at the center of the targeted uniform light intensity distributions 50a and 50b, serving as the second light intensity distribution, having a bipolar shape, as illustrated in FIG. 9A.

Then, the adjustment method obtains a light intensity radial distribution Ir(r) of the targeted uniform light intensity distributions 50a and 50b having a bipolar shape by integrating a light intensity I (r, θ) at each point within an area S2 (r=Ri–Ro, θ=0–2π) in the light intensity distributions 50a and 50b in the circumferential direction (θ=0–2π).

Next, in step T12, the adjustment method obtains a cumulative light quantity distribution Er (R) by integrating the light intensity radial distribution Ir(r) calculated in step T11 in the radial direction. In step T13, the adjustment method measures a light intensity distribution (a first light intensity distribution) formed on the illumination pupil plane 5b. That is, the adjustment method measures a light intensity distribution having a bipolar shape formed on the pupil plane 5b in the illumination optical system with, for example, the light detector 30.

In step T14, the adjustment method obtains a light intensity radial distribution by integrating the light intensity distribution measured in step T13 in the radial direction. In step T15, the adjustment method obtains a cumulative light quantity distribution of the light intensity distribution having a bipolar shape on the illumination pupil plane 5b by integrating the light intensity radial distribution measured in step T14 in the radial direction.

In step T16, the adjustment method calculates a square sum of difference at each of at least three points, i.e., at each distance R, between the cumulative light quantity distribution in the radial direction of the targeted light intensity distribution 40 and the cumulative light quantity distribution of the first light intensity distribution formed on the illumination pupil plane 5b in the radial direction.

If a mean value of a sum of squared difference between each distance R in the cumulative light quantity distributions is 0.005 or less, the process proceeds to step T18. On the other hand, if the aforementioned mean value of a sum of squared difference between each distance R in the cumulative light quantity distributions becomes greater than 0.005, then in step T17, the adjustment method adjusts the first light intensity distribution formed on the pupil plane 5b. That is, the adjustment method optically adjusts the first light intensity distribution formed on the illumination pupil plane 5b so that a sum of squared difference between each distance R in the cumulative light quantity distributions of the targeted light intensity distributions 50a and 50b and the first light intensity distribution formed on the illumination pupil plane 5b is decreased.

Then, the process returns to step T13 and the above-described processing is repeated so that the sum of squared difference becomes 0.005 or less. On the other hand, if the mean value of the sum of squared difference is 0.005 or less, then in step T18, the adjustment method obtains a light intensity angle distribution of the targeted light intensity distributions 50a and 50b having a bipolar shape by integrating a light intensity at each point within the light intensity distributions 50a and 50b in the radial direction with reference to the central point O.

This means that the light intensity angle distribution is obtained by integrating each point in the light intensity distribution 50a and the light intensity distribution 50b in the radial direction with reference to the central point O. That is, the adjustment method obtains a light intensity angle distribution Iθ(θ) of the targeted uniform light intensity distributions 50a and 50b having a bipolar shape by the following equation (3), in which a light intensity I (r, θ) at each point within an area S2 in the light intensity distributions 50a and 50b is integrated in the radial direction (r=Ri–Ro).

$$I_\theta(\theta) = \int_{Ri}^{Ro} I(r, \theta) \cdot r dr \qquad (3)$$

Figure 9B:
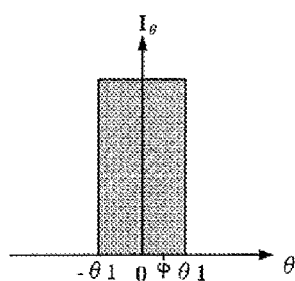

At this time, the light intensity angle distribution of the uniform light intensity distributions 50a and 50b having a bipolar shape illustrated in FIG. 9A will be as illustrated in FIG. 9B.

Next, in step T19, the adjustment method obtains a cumulative light quantity distribution Eθ (φ) by integrating the light intensity angle distribution Iθ(θ) obtained in step T18 in the circumferential direction (θ=0–±φ).

The cumulative light quantity distribution Eθ (φ) in the circumferential direction is obtained by the following equation (4). Here, the equation (4) is normalized by a total quantity of light of the light intensity distributions 50a and 50b as is with the equation (2) used for obtaining a cumulative light quantity distribution in the radial direction.

$$E_\theta(\phi) = \left( \int_0^\phi I_\theta(\theta)\,d\theta + \int_0^{-\phi} I_\theta(\theta)\,d\theta \right) \bigg/ \int\int_{S2} I(r,\theta) \cdot r\,dr\,d\theta \quad (4)$$

Figure 9C:
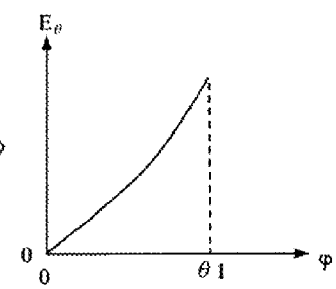

At this time, the cumulative light quantity distribution of the uniform light intensity distribution 50b having a bipolar shape illustrated in FIG. 9A in the circumferential direction will be as illustrated in FIG. 9C ($\phi$=0−θ1). The cumulative light quantity distribution 50a is similar to the cumulative light quantity distribution of 50b.

Subsequently, in step T20, the adjustment method obtains a light intensity angle distribution of each pole in the bipolar-shaped light intensity distribution and measured in step T13. That is, the adjustment method obtains the light intensity angle distribution by integrating the measured light intensity distribution in the radial direction. Next, in step T21, the adjustment method obtains a cumulative light quantity distribution of the first light intensity distribution on the illumination pupil plane 5b for each pole by integrating the light intensity angle distribution obtained in step T20 in the circumferential direction.

Further, in step T22, the adjustment method obtains a sum of squared difference at each of at least two corresponding points in the cumulative light quantity distribution of each pole in the targeted light intensity distribution in the circumferential direction obtained in step T19 and the cumulative light quantity distribution of each corresponding pole in the light intensity distribution on the illumination pupil plane 5b in the circumferential direction obtained in step T21, where a total quantity of light in each light intensity distribution is 1.

At this time, a number m of the divided angles of the angle θ used for calculating the difference can be high in number, i.e., a large number of calculation steps is useful. The calculation is performed for, for example, each one degree of the angle θ.

If the sum of squared difference at each point in the cumulative light quantity distributions of the targeted light intensity distributions 50a and 50b and the first light intensity distribution formed on the illumination pupil plane 5b in the radial direction is sufficiently small, the targeted light intensity distributions 50a and 50b and the first light intensity distribution formed on the illumination pupil plane 5b will have similar imaging characteristics, when the sum of squared difference of the cumulative light quantity at each angle φ in the circumferential direction is small. The sum of squared difference at each point in the cumulative light quantity distributions in the radial direction is regarded as sufficiently small when the mean value of the sum of squared difference is 0.002 or less.

In step T22, if a mean value of a sum of squared difference (sum of squared difference/n) at each point in the cumulative light quantity distributions in the circumferential direction is 0.002 or less, the adjustment method determines the first light intensity distribution formed on the illumination pupil plane 5b to be practically and sufficiently equivalent to the targeted light intensity distribution.

Here, if a mean value of a sum of squared difference (sum of squared difference/m) between each angle φ in the cumulative light quantity distributions in the circumferential direction is 0.002 or less, the adjustment of the illumination optical system or the illumination apparatus ends in step T24.

However, if the aforementioned mean value of a sum of squared difference between each angle φ in the cumulative light quantity distributions becomes greater than 0.002, then in step T23, the adjustment method performs an optical adjustment so that the sum of squared difference of each angle φ in the cumulative light quantity distribution of each pole in the circumferential direction of the targeted light intensity distribution and the cumulative light quantity distribution of each corresponding pole in the circumferential direction of the first light intensity distribution formed on the illumination pupil plane 5b becomes small. More specifically, if the mean value of a sum of squared difference between each angle φ in the cumulative light quantity distributions in the circumferential direction is greater than 0.002, the adjustment method adjusts the light intensity distribution formed on the illumination pupil plane 5b in the illumination optical system so that a sum of squared difference between each angle φ in the cumulative light quantity distributions is decreased. Then, the process returns to step T13 and the above-described processing is repeated until the mean value of the sum of squared difference of the cumulative light quantity distributions becomes 0.002 or less.

As a result, a multipolar light intensity distribution formed on an illumination pupil plane in an illumination apparatus can be adjusted with high precision to a multipolar light intensity distribution that is substantially equivalent to a targeted light intensity distribution in consideration of not only its shape but also its nonuniform distribution. In this way, without actually printing a pattern to confirm the light intensity distribution, a difference of imaging characteristics in the exposure apparatus can be adjusted and an optimum multipolar light intensity distribution for a device pattern can be set with high precision on the exposure apparatus.

The above description describes a method for adjusting a light intensity distribution on the illumination pupil plane 5b in the illumination optical system equivalent to a targeted uniform light intensity distribution having a bipolar shape. By exchanging a role of the light intensity distribution formed on the illumination pupil plane 5b in the illumination optical system with the targeted uniform light intensity distribution having a bipolar shape, the light intensity distribution in the exposure apparatus can be evaluated as the light intensity distribution having a uniform distribution with a bipolar shape.

For example, an evaluation method obtains a light intensity distribution having a bipolar shape with a minimum sum of squared difference of each distance R in the cumulative light quantity distributions in the radial direction with the cumulative light quantity distributions of the light intensity distribution having a bipolar shape formed on the illumination pupil plane 5b in the illumination optical system that is measured by the light detector 30. Then, the evaluation method obtains a light intensity distribution having a bipolar shape with a minimum sum of squared difference of each angle φ in the cumulative light quantity distributions in the circumferential direction. In this way, the evaluation method can obtain an outer diameter, inner diameter, and aperture angle, which are main parameters of the uniform light intensity distribution having a bipolar shape that is substantially equivalent to the targeted light intensity distribution.

According to this evaluation method, if a uniform light intensity distribution having a bipolar shape equivalent to the targeted bipolar light intensity distribution is obtained in advance, a time length required for adjusting the exposure apparatus and the illumination apparatus can be reduced. For example, by making an optical adjustment so that a uniform light intensity distribution having a bipolar shape equivalent to a light intensity distribution formed on the illumination pupil plane 5b agrees with a uniform light intensity distribution having a bipolar shape equivalent to the targeted light intensity distribution, a light intensity distribution that is substantially equivalent to the targeted light intensity distribution can be formed on the illumination pupil plane 5b. With this optical adjustment, a time length required for adjusting and evaluating the light intensity distribution in the illumination optical system can be reduced.

While the second present exemplary embodiment has been described with reference to the adjustment and evaluation of the light intensity distribution having a bipolar shape, it is to be understood that the present invention is not limited to such an example. For example, the adjustment and evaluation according to an exemplary embodiment of the present invention can be applied to a light intensity distribution having various shapes.

Figure 11A:
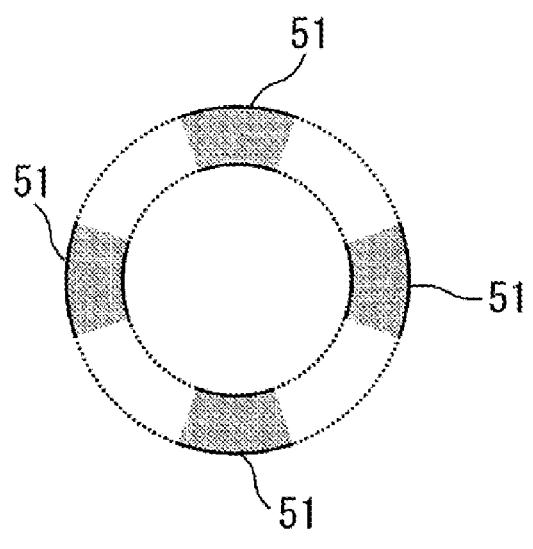
FIGS. 11A and 11B illustrate an example of adjusting and evaluating a light intensity distribution having a multipolar shape other than the light intensity distribution having a bipolar shape according to the second exemplary embodiment of the present invention.
Figure 11B:
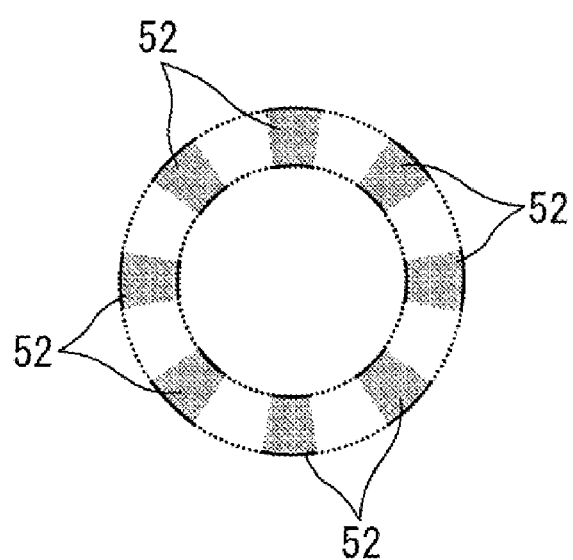

For example, the aforementioned method used for the light intensity distribution having a bipolar shape can be applied to a quadrupolar light intensity distribution 51 or an octupolar light intensity distribution 52 illustrated in FIGS. 11A and 11B, respectively.

Figure 12:
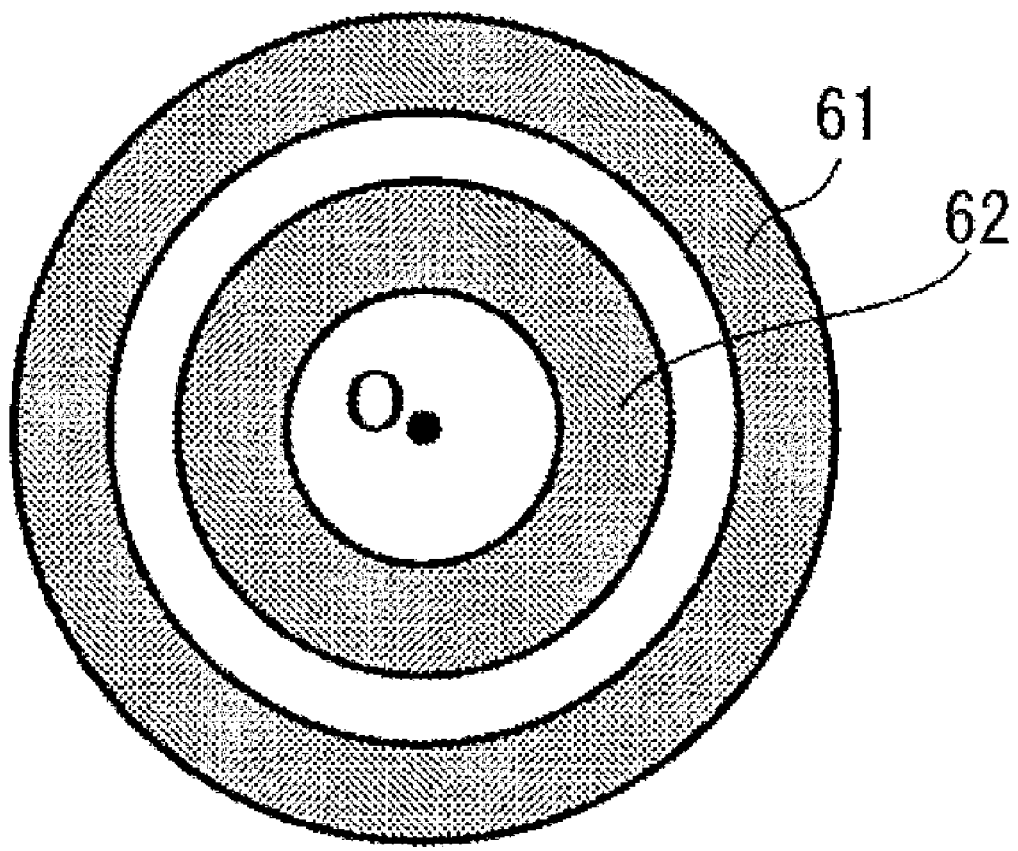
FIG. 12 illustrates an example of adjusting and evaluating a light intensity distribution having a double annular shape according to the second exemplary embodiment of the present invention.

Further, for example, in the case of a double annular shape light intensity distribution having two light intensity distributions 61 and 62 with a central point O as illustrated in FIG. 12, the method used for a light intensity distribution having an annular shape can be applied to each of the light intensity distributions 61 and 62.

Figure 13:
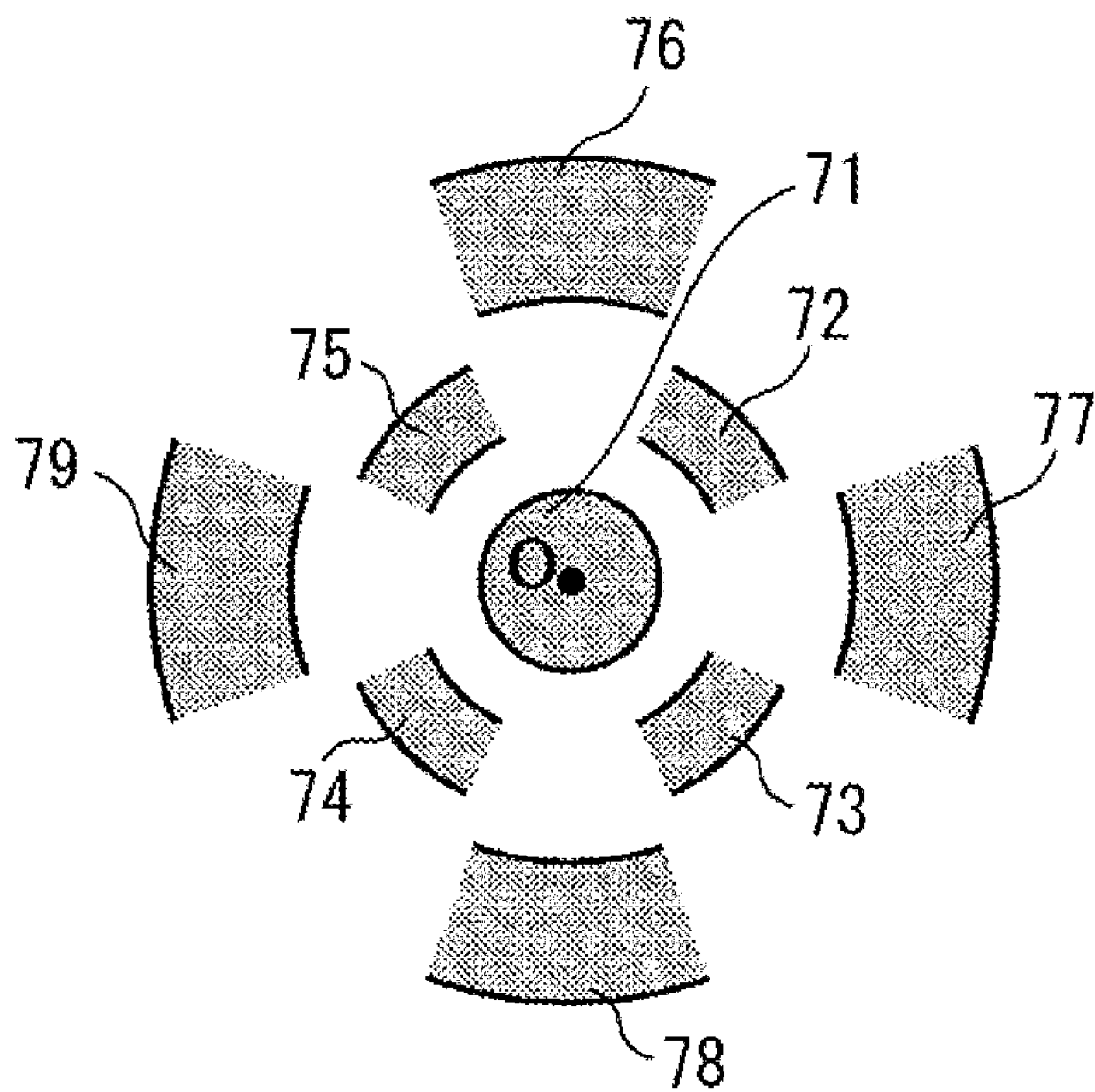
FIG. 13 illustrates an example of adjusting and evaluating a light intensity distribution having a combination of a multipolar shape and an circular shape according to the second exemplary embodiment of the present invention.

Next, a case of adjusting and evaluating a 9-polar light intensity distribution as illustrated in FIG. 13 will be described. The 9-polar light intensity distribution has a circular light intensity distribution 71, quadrupolar light intensity distributions 72-75, and quadrupolar light intensity distributions 76-79, all of which have a point O at the center.

In this case, the method used for a circular light intensity distribution can be applied to the circular light intensity distribution 71, and the above-described method used for a bipolar light intensity distribution can be applied to the inner quadrupolar light intensity distributions 72-75 and the outer quadrupolar light intensity distributions 76-79. Further, by combining the method for a light intensity distribution having a substantially annular shape and the method for a bipolar light intensity distribution, the adjustment and evaluation methods according to an exemplary embodiment of the present invention can be applied to a light intensity distribution having various shapes.

Figure 14:
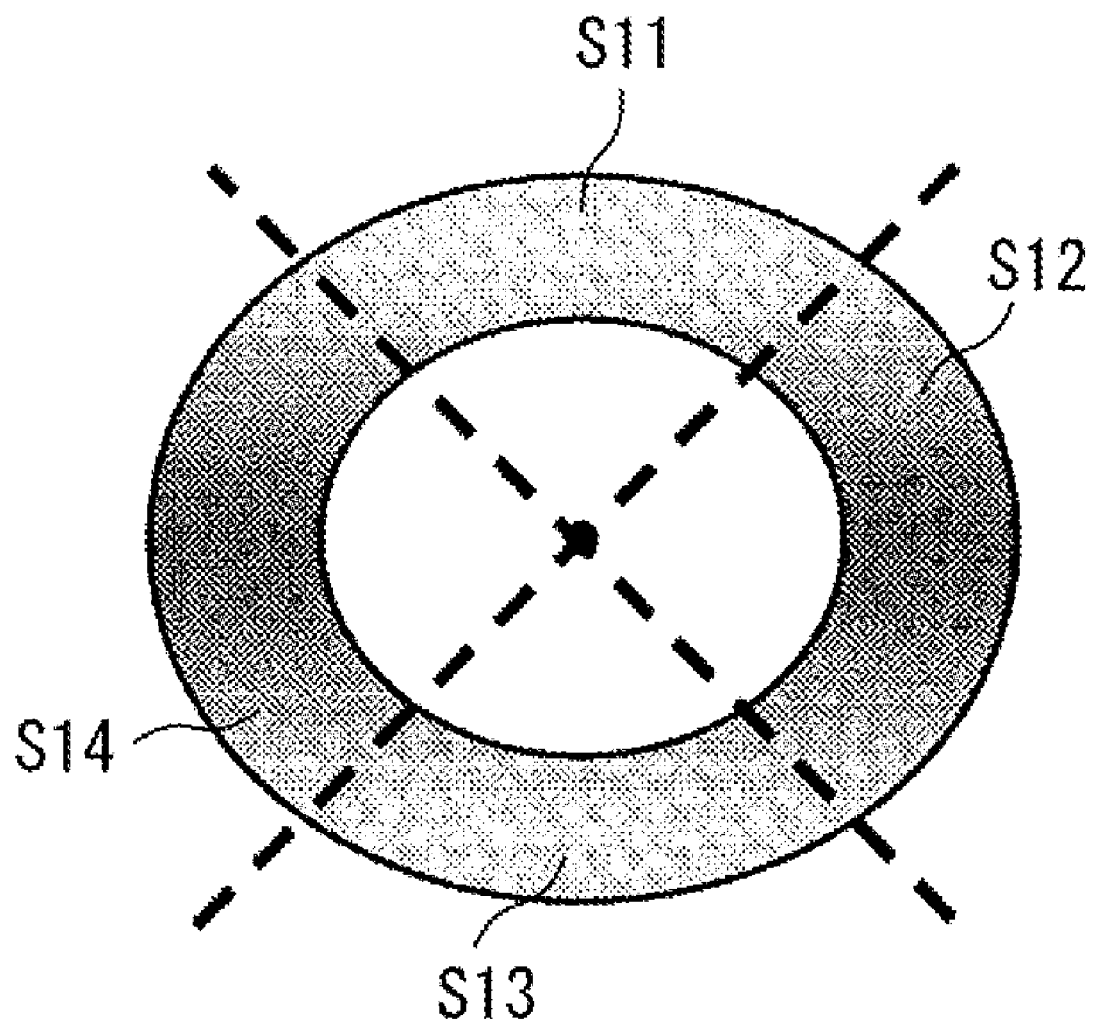
FIG. 14 illustrates an example of adjusting and evaluating a light intensity distribution having a substantially oval annular shape by dividing the light intensity distribution area into a plurality of areas according to the second exemplary embodiment of the present invention.

In a case where a variation in a pattern line width between exposure apparatuses needs to be controlled, a targeted light intensity distribution having a substantially annular shape may have an elliptic shape as illustrated in FIG. 14, where the facing distributions have a different intensity from the adjacent distributions. In such a case, the vertical line width and the horizontal line width may be unbalanced even if the sum of squared difference of the cumulative light quantity distribution of each distance R in the light intensity distributions S11-S14 in the radial direction is decreased.

Therefore, in such a case, the light intensity distribution formed on the illumination pupil plane 5b is adjusted by dividing the elliptic light intensity distribution into a plurality of areas S11-S14 as illustrated in FIG. 14 so that the sum of squared difference of each distance R in the cumulative light quantity distribution of each divided area becomes small. Simultaneously, the ratio of a light quantity of each of the areas S11-S14 can be adjusted to be ±3% or less compared to the targeted light intensity distribution.

Further, if a polarization performance is different among the areas S11-S14, the vertical line width and the horizontal line width may be unbalanced. Therefore, a polarization performance RoP obtained in the following equation (5) can be adjusted to be ±2% or less for each of the divided areas compared to the targeted light intensity distribution.

$$RoP = Is/(Is+Ip) \quad (5)$$

Here, Is is an intensity of s-polarized light, and Ip is an intensity of p-polarized light.

Furthermore, in a case where the light intensity distribution has a multipolar shape, for example, a sum of squared difference of each distance R in the cumulative light quantity distribution of a light intensity distribution of each pole and the cumulative light quantity distribution of the targeted light intensity distribution of the corresponding pole in the radial direction is decreased. Further, a light quantity ratio at each pole can be ±3% or less as compared with the targeted light intensity distribution, and the polarization performance RoP can be ±2% or less as compared with each targeted light intensity distribution. For example, a ratio of a sum of each light intensity in each divided area in the first light intensity distribution on the illumination pupil plane 5b is adjusted to ±3% or less as compared with the targeted second light intensity distribution. Further, the polarization performance of each divided area of the first light intensity distribution can be adjusted to ±2% or less as compared with the second light intensity distribution.

The above-described exposure apparatus is configured to manufacture a micro device by illuminating a reticle (mask) using the illumination apparatus. A substrate, which is coated with a photosensitive material, is exposed to light with a pattern-formed reticle in the projection optical system.

The micro device, which is manufactured, includes, for example, a semiconductor device, an image sensor, a liquid crystal display device, a thin-film magnetic head.

Exemplary Embodiment of Device Manufacturing Method

Figure 15:
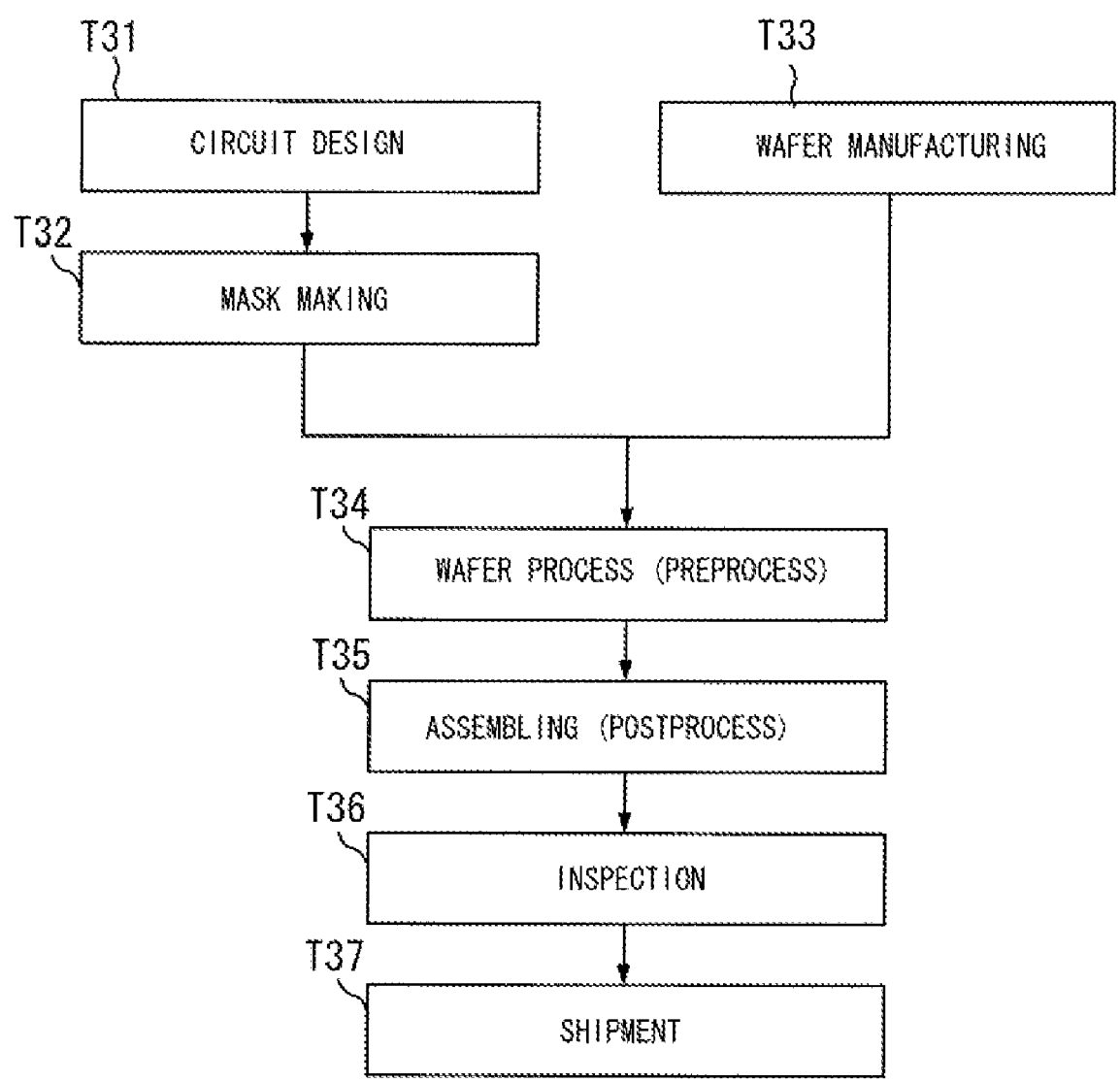
FIG. 15 is a flowchart illustrating a device manufacturing method according to an exemplary embodiment of the present invention.

FIG. 15 is a flowchart illustrating exemplary manufacturing processes for a micro device using the above-described exposure apparatus.

Step T31 is a circuit design process for designing a circuit pattern of a semiconductor device. Step T32 is a mask making process for fabricating a mask, which can be referred to as a reticle, based on a designed circuit. Step T33 is a wafer manufacturing process for manufacturing a wafer, which can be referred to as a substrate, from a silicon or compatible material.

Step T34 is a wafer process, which can be referred to as "preprocess", for forming an actual circuit on a wafer using an exposure apparatus with the above-described prepared mask according to the lithography technique. Step T35 is an assembling process, which can be referred to as "postprocess", for forming a semiconductor chip using the wafer manufactured in step T34. The postprocess includes an assembly process (e.g., dicing, bonding, etc.) and a packaging process (chip sealing).

Step T36 is an inspection process for inspecting the semiconductor device manufactured in step T35. The inspection includes an operation confirmation test and an endurance test. Step T37 is a shipment process for shipping the semiconductor device completed through the above-described processes.

Figure 16:
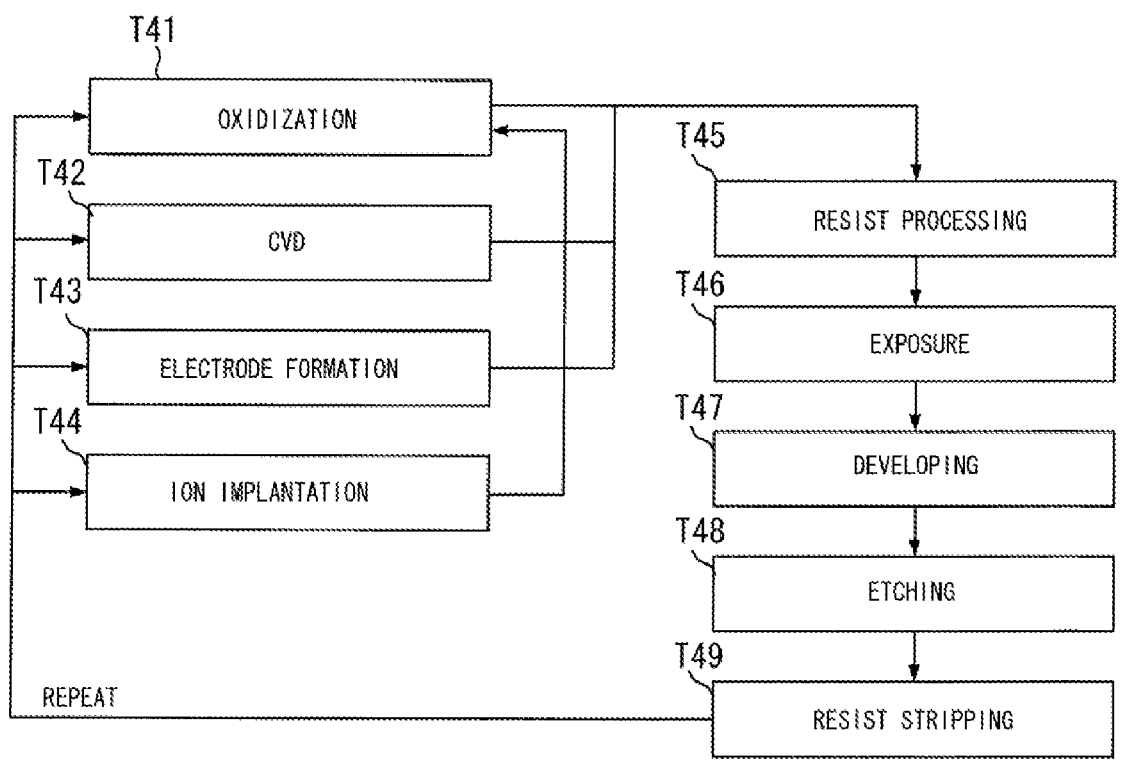
FIG. 16 is a detailed flowchart illustrating a wafer process illustrated in FIG. 15 according to an exemplary embodiment of the present invention.

As illustrated in FIG. 16, the above-described wafer process in step T34 includes an oxidation step T41 for oxidizing a wafer surface and a chemical vapor deposition (CVD) step T42 for forming an insulating film on the wafer surface.

Further, the wafer process in step T43 includes an electrode formation step T43 for forming electrodes on the wafer by vaporization, an ion implantation step T44 for implanting ions into the wafer, and a resist processing step T45 for coating the wafer with a photosensitive material.

Furthermore, the wafer process in step T43 includes an exposure step T46 for exposing the wafer subjected to the resist processing step to light using the above-described exposure apparatus with a mask having a circuit pattern, a developing step T47 for developing the wafer exposed in the exposure step T46, an etching step T48 for cutting a portion other than a resist image developed in the developing step T47, and a resist stripping step T49 for removing an unnecessary resist remaining after the etching step T48.

The processing repeating the above-described steps can form multiple circuit patterns on a wafer. Using the manufacturing method according to an exemplary embodiment of the present invention, a semiconductor device having an extremely fine circuit pattern can be manufactured with higher precision and improved throughput.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-013183 filed Jan. 23, 2007, which is hereby incorporated by reference herein in its entirety.

What is claimed is:

1. A method for adjusting a first light intensity distribution formed on a pupil plane of an illumination apparatus configured to illuminate a mask for projecting a pattern of the mask on a substrate to a light intensity distribution substantially equivalent to a targeted second light intensity distribution, the method comprising:

measuring the first light intensity distribution;

obtaining a first light intensity radial distribution by integrating a light intensity of each point in an area in the measured first light intensity distribution in a circumferential direction with respect to a predetermined central point and a second light intensity radial distribution by integrating a light intensity of each point in an area in the second light intensity distribution in the circumferential direction with respect to a predetermined central point;

obtaining a first cumulative light quantity distribution in a radial direction by integrating the first light intensity radial distribution in the radial direction with respect to the central point and a second cumulative light quantity distribution in the radial direction by integrating the second light intensity radial distribution in the radial direction with respect to the central point;

obtaining a difference at each of at least three points between the first cumulative light quantity distribution and the second cumulative light quantity distribution; and adjusting the first light intensity distribution based on the difference between the first cumulative light quantity distribution and the second cumulative light quantity distribution; and adjusting the first light intensity distribution based on the difference between the first cumulative light quantity distribution and the second cumulative light quantity distribution.

2. The method according to claim 1, further comprising adjusting the first light intensity distribution based on a square sum of the difference between the first cumulative light quantity distribution and the second cumulative light quantity distribution.

3. The method according to claim 2, further comprising adjusting the first light intensity distribution to make a mean value of the square sum of the difference at each of at least three points between the first cumulative light quantity distribution and the second cumulative light quantity distribution to be 0.005 or less, where a total quantity of light of each of the first light intensity distribution and the second light intensity distribution is 1.

4. The method according to claim 1, wherein the first light intensity distribution has a circular shape or an annular shape.

5. The method according to claim 1, wherein the first light intensity distribution has a multipolar shape.

6. The method according to claim 1, further comprising:

dividing each of the first light intensity distribution and the second light intensity distribution into at least two areas; and adjusting the first light intensity distribution with respect to each of the areas.

7. The method according to claim 6, further comprising adjusting a ratio of a sum of a light intensity of each of the divided areas of the first light intensity distribution to that of the second light intensity distribution to be ±3% or less.

8. The method according to claim 6, further comprising adjusting a polarization performance RoP of each of the divided areas of the first light intensity distribution to be ±2% or less compared to the second light intensity distribution, wherein $RoP=Is/(Is+Ip)$ where Is is an intensity of s-polarized light and Ip is an intensity of p-polarized light.

9. A method for adjusting a first multipolar light intensity distribution formed on a pupil plane of an illumination apparatus configured to illuminate a mask for projecting a pattern of the mask on a substrate to a light intensity distribution substantially equivalent to a targeted second multipolar light intensity distribution, the method comprising:

measuring the first multipolar light intensity distribution;

obtaining a first light intensity angle distribution by integrating a light intensity of each point in an area in a light intensity distribution of a first pole in the measured first multipolar light intensity distribution in a radial direction with respect to a predetermined central point and a second light intensity angle distribution by integrating a light intensity of each point in an area in a light distribution of a second pole, corresponding to the first pole, in the second multipolar light intensity distribution in the radial direction with respect to a predetermined central point;

obtaining a first cumulative light quantity distribution in a circumferential direction by integrating the first light intensity angle distribution in the circumferential direction with respect to the central point and a second cumulative light quantity distribution in the circumferential direction by integrating the second light intensity angle distribution in the circumferential direction with respect to the central point;

obtaining a difference at each of at least two points between the first cumulative light quantity distribution of the first pole in the first multipolar light intensity distribution and the second cumulative light quantity distribution of the second pole in the second multipolar light intensity distribution; and adjusting the first multipolar light intensity distribution based on the difference between the first cumulative light quantity distribution and the second cumulative light quantity distribution.

10. The method according to claim 9, further comprising adjusting the first multipolar light intensity distribution based on a square sum of the difference at each of at least two points between the first cumulative light quantity distribution of the first pole and the second cumulative light quantity distribution of the second pole corresponding to the first pole.

11. The method according to claim 10, further comprising adjusting the first multipolar light intensity distribution to make a mean value of the square sum of the difference at each of at least two points between the first cumulative light quantity distribution of the first pole and the second cumulative light quantity distribution of the second pole corresponding to the first pole to be 0.002 or less, where a total quantity of light of each of the first pole and the second pole is 1.

12. The method according to claim 9, further comprising:
dividing each of the first multipolar light intensity distribution and the second multipolar light intensity distribution into at least two areas; and
adjusting the first multipolar light intensity distribution with respect to each of the areas.

13. The method according to claim 12, further comprising adjusting a ratio of a sum of a light intensity of each of the divided areas of the first multipolar light intensity distribution to that of the second multipolar light intensity distribution to be ±3% or less.

14. The method according to claim 12, further comprising adjusting a polarization performance RoP of each of the divided areas of the first multipolar light intensity distribution to be ±2% or less compared to the second multipolar light intensity distribution, wherein $RoP=Is/(Is+Ip)$ where Is is an intensity of s-polarized light and Ip is an intensity of p-polarized light.

15. A method for evaluating a first light intensity distribution formed on a pupil plane in an illumination apparatus configured to illuminate a mask for projecting a pattern of the mask on a substrate as a second light intensity distribution that is uniform and equivalent to the first light intensity distribution, the method comprising:
obtaining a light intensity radial distribution by integrating a light intensity of each point in an area in the first light intensity distribution in a circumferential direction with respect to a predetermined central point;
obtaining a cumulative light quantity distribution in a radial direction by integrating the light intensity radial distribution in the radial direction with respect to the central point; and
obtaining a parameter of the second light intensity distribution with a minimum square sum of difference at each of at least three points between the cumulative light quantity distribution obtained from the first light intensity distribution and a cumulative light quantity distribution obtained from the second light intensity distribution.

16. The method according to claim 15, wherein the first light intensity distribution has a circular shape, and
wherein the parameter includes a radius of the circular shape with the central point at a center of the circular shape.

17. The method according to claim 15, wherein the first light intensity distribution has an annular shape, and
wherein the parameter includes an outer diameter and an inner diameter of the annular shape with the central point at a center of the annular shape.

18. The method according to claim 15, wherein the first light intensity distribution has a multipolar shape, and
wherein the parameter includes an outer diameter and an inner diameter of an annular shape with the central point at a center of the annular shape.

19. A method for evaluating a first multipolar light intensity distribution formed on a pupil plane in an illumination apparatus configured to illuminate a mask for projecting a pattern of the mask on a substrate as a second multipolar light intensity distribution that is uniform and equivalent to the first multipolar light intensity distribution, the method comprising:
obtaining a light intensity angle distribution by integrating a light intensity of each point in an area in the first multipolar light intensity distribution in a radial direction with respect to a predetermined central point;
obtaining a cumulative light quantity distribution in a circumferential direction by integrating the light intensity angle distribution corresponding to a first pole in the first multipolar light intensity distribution with respect to the predetermined central point from a predetermined angle; and
obtaining an aperture angle of a second pole, corresponding to the first pole, in the second multipolar light intensity distribution with a minimum square sum of difference at each of at least two points between the cumulative light quantity distribution of the first pole and a cumulative light quantity distribution of the second pole.

20. The method according to claim 15, further comprising:
dividing the first multipolar light intensity distribution into at least two areas; and
evaluating the first multipolar light intensity distribution with respect to each of the areas.

21. A method for adjusting a light intensity distribution formed on a pupil plane in an illumination apparatus configured to illuminate a mask for projecting a pattern of the mask on a substrate, the method comprising:
measuring a first light intensity distribution formed on the pupil plane in the illumination apparatus;
evaluating the measured first light intensity distribution using the method according to claim 15; and
adjusting the first light intensity distribution based on the evaluation of the first light intensity distribution.

22. An exposure apparatus comprising:
an illumination apparatus having a first light intensity distribution adjusted by the method according to claim 1; and
a projection optical system configured to project a pattern formed on a mask onto a substrate using illumination light from the illumination apparatus.

23. An exposure apparatus comprising:
an illumination apparatus having a first light intensity distribution adjusted by the method according to claim 9; and
a projection optical system configured to project a pattern formed on a mask onto a substrate using illumination light from the illumination apparatus.

* * * * *